US005969544A

United States Patent [19]

Iwao et al.

[11] Patent Number: 5,969,544

[45] Date of Patent: Oct. 19, 1999

[54] CLOCK DRIVER CIRCUIT AND SEMICONDUCTOR INTEGRATED CIRCUIT DEVICE INCORPORATING THE CLOCK DRIVER CIRCUIT

[75] Inventors: Takenobu Iwao; Nobuyuki Ikeda; Miho Yokota, all of Tokyo, Japan

[73] Assignee: Mitsubishi Denki Kabushiki Kaisha, Tokyo, Japan

[21] Appl. No.: 08/867,851

[22] Filed: Jun. 3, 1997

[30] Foreign Application Priority Data

Nov. 29, 1996 [JP] Japan .................................... 8-319746

[51] Int. Cl.[6] ............................ H03K 19/00; H01L 25/00

[52] U.S. Cl. ............................ 326/93; 326/101; 326/47; 327/297; 257/206

[58] Field of Search ....................... 326/41, 47, 101–103, 326/93; 327/293, 297; 257/206, 207, 208

[56] References Cited

U.S. PATENT DOCUMENTS

| | | | |
|---|---|---|---|
| Re. 34,363 | 8/1993 | Freeman | 326/38 |
| 4,975,884 | 12/1990 | Waller | 365/230.06 |
| 5,444,276 | 8/1995 | Yokota et al. . | |
| 5,452,261 | 9/1995 | Chung et al. | 365/233 |
| 5,457,408 | 10/1995 | Leung | 326/38 |
| 5,493,239 | 2/1996 | Zlotnick | 326/38 |
| 5,543,730 | 8/1996 | Cliff et al. | 326/38 |
| 5,608,342 | 3/1997 | Trimberger | 326/38 |
| 5,640,106 | 6/1997 | Erickson et al. | 326/38 |
| 5,650,734 | 7/1997 | Chu et al. | 326/38 |

FOREIGN PATENT DOCUMENTS

| | | |
|---|---|---|
| 61-226943 | 10/1986 | Japan . |
| 6-236923 | 8/1994 | Japan . |
| 7-14994 | 1/1995 | Japan . |

*Primary Examiner*—Michael Tokar
*Assistant Examiner*—Richard Roseen
*Attorney, Agent, or Firm*—Burns, Doane, Swecker & Mathis, L.L.P.

[57] ABSTRACT

A plurality of macro cell layout regions 9 in cell regions 2 on a semiconductor substrate 1 are divided into three portions in a second direction. Each of the divided portions is provided with basic circuits 14*a* through 14*c*. In each basic circuit, a first common line 16 is connected to an output node of a clock input driver 11 via a clock output line 17. A plurality of predrivers 15(1) through 15(n) have their input nodes IN connected to the first common line 16 and have their output nodes OUT connected to a second common line 18. A plurality of main drivers 19(1) through 19*m* have their input nodes IN connected to the second common line 18 and have their output nodes OUT connected to a third common line 20. The third common line is connected to a plurality of clock signal supply lines 21(1) through 21(s) commonly provided to the basic circuits 14*a* through 14*c*. The clock signal supply lines 21(1) through 21(s) are connected to clock input nodes of internal circuits 22 each requiring a clock signal.

14 Claims, 9 Drawing Sheets

CLOCK DRIVER CIRCUIT AND SEMICONDUCTOR INTEGRATED CIRCUIT DEVICE INCORPORATING THE CLOCK DRIVER CIRCUIT

BACKGROUND ON THE INVENTION

1. Technical Field

The present invention relates to a semiconductor integrated circuit device such as a gate array or an embedded cell array (ECA), and more particularly, to a clock driver circuit provided in that semiconductor integrated circuit device.

2. Background Art

In semiconductor integrated circuit devices including gate arrays and embedded cell arrays, the core region has two kinds of macro cells formed therein, namely, a plurality of macro cells acting as logic circuits such as AND and/or OR circuits, and a plurality of macro cells acting as internal circuits such as flip-flop circuits each requiring a clock signal. Clock driver circuits are provided to supply clock signals to the multiple internal circuits.

In recent years, semiconductor integrated circuit devices have been required which are larger in scale and faster in operation than ever before. The requirements have prompted a proposal, among others, to increase the number of internal circuits in each semiconductor integrated circuit device and to more efficiently supply the internal circuits with clock signals with smaller clock skews. FIG. 12 is a plan pattern view of a conventional semiconductor integrated circuit device based on that proposal, illustratively disclosed in Japanese Patent Laid-Open No. Hei 7-14994.

In FIG. 12, a semiconductor substrate 100 has an internal integrated circuit group (core region) 101 and oppositely positioned peripheral circuit groups (buffer regions) 102. A first signal driver circuit (clock input driver) 103 is located in one of the oppositely positioned peripheral circuit groups 102, and amplifies a reference signal (clock signal). A plurality of second signal driver circuits (column drivers) 104 are located in another one of the oppositely positioned peripheral circuit groups 102 contiguous to the first peripheral circuit group, and are positioned at both ends of the internal integrated circuit group 101 contiguous to the peripheral circuit groups 102. First signal lines 105 connect the first and second signal driver circuits 103 and 104. Second signal lines 106 connect the second signal driver circuits 104 to the internal integrated circuit group 101.

In the above setup, the first signal driver circuit 103 amplifies the reference signal. The amplified reference signal is fed to the second signal driver circuits 104 via the first signal lines 105 arranged symmetrically as viewed from the first signal driver circuit 103. The second signal driver circuits 104 amplify the reference signal, and allow a uniform reference signal to be supplied onto the second signal lines 106 wired in a comb-like manner. This makes it possible to minimize fluctuations in the reference signal reaching the internal integrated circuit group 101. Using the reference signal with reduced signal delays, i.e., with reduced clock skews, the internal integrated circuit group 101 processes various signals. Another technique proposed in connection with the above semiconductor integrated circuit device involves installing an easy-to-install clock driver circuit of high driving capacity without increasing the area of the semiconductor substrate. FIG. 13 is a partial plan pattern view of such a conventional semiconductor integrated circuit device based on the above proposal, illustratively disclosed in Japanese Patent Laid-Open No. Hei 6-236923.

In FIG. 13, a macro cell layout region 201 extends on a semiconductor substrate. A power supply line 202*a* provides a supply potential VDD, and is composed of a second aluminum wiring layer formed perpendicularly to the macro cell layout region 201. A ground line 202*b* provides a ground potential GND, and is made of a second aluminum wiring layer formed perpendicularly to the macro cell layout region 201 and in parallel with the power supply line 202*a*. The ground line 202*b* and power supply line 202*a* constitute a power supply line pair. A power supply line 203*a* is located above the macro cell layout region 201, connected to the power supply line 202*a* via through-holes 204*a*, and is made of a first aluminum wiring layer. A ground line 203*b* is located below the macro cell layout region 201, connected to the ground line 202*b* via through-holes 204*b*, and is made of the first aluminum wiring layer.

Also in FIG. 13, a macro cell 205 is located below the power supply lines 202*a*, 202*b* in the macro cell layout region 201 and has functions including a driver circuit function. An input signal line 206 is connected to the input node of the macro cell 205 via a through-hole 207 in order to input signals to that cell. Made of the second aluminum wiring layer, the input signal line 206 extends between the power supply line 202*a* and the ground line 202*b* in parallel therewith. An output signal line 208 is connected to the output node of the macro cell 205 via through-holes 209 in order to output signals from that cell. Composed of the second aluminum wiring layer, the output signal line 208 also extends between the power supply line 202*a* and the ground line 202*b* in parallel therewith.

In the conventional semiconductor integrated circuit device of the constitution outlined above, the macro cell 205 having functions including that of driver circuits is located below the power supply line pair made up of the power supply line 202*a* and ground line 202*b*. This configuration facilitates the supply of power to the macro cell 205, and helps reduce the area occupied by the macro cell 205 on the semiconductor substrate.

As semiconductor integrated circuit devices are required to be larger in scale and faster in operation than ever before, there is a growing need for a clock driver circuit offering a higher-than-ever driving capability with smaller clock skews.

SUMMARY OF THE INVENTION

It is therefore an object of the present invention to provide a clock driver circuit offering an enhanced driving capability with reduced clock skews for use with a plurality of internal circuits each requiring a clock signal.

It is another object of the invention to provide a semiconductor integrated circuit device such as a gate array and an embedded cell array supplying a plurality of internal circuits thereof each requiring a clock signal with a clock signal having a minimum clock skew.

It is a further object of the invention to provide a semiconductor integrated circuit device such as a gate array or an embedded cell array for accommodating in a macro cell layout region a clock driver circuit supplying a plurality of internal circuits each requiring a clock signal having a minimum clock skew, without diminishing the area to be occupied by other macro cells.

According to one aspect of the present invention, a clock driver circuit comprises a plurality of internal circuits, a plurality of clock signal supply lines, and a plurality of basic circuits.

The plurality of internal circuits, which require a clock signal, are formed on a principal plane of a semiconductor substrate. The plurality of clock signal supply lines are formed on the principal plane of the semiconductor substrate, and are connected electrically to clock input nodes of predetermined internal circuits among the plurality of internal circuits. Also, the plurality of basic circuits each amplifies received clock signals and supplies the clock signals to the plurality of clock signal supply lines.

Each of the plurality of basic circuits comprises a first common line formed on the principal plane of the semiconductor substrate for receiving the clock signals. A plurality of predrivers are formed on the principal plane of the semiconductor substrate, input nodes of the plurality of predrivers being connected electrically to the first common line. A second common line is formed on the principal plane of the semiconductor substrate and connected electrically to output nodes of the plurality of predrivers. A plurality of main drivers are formed on the principal plane of the semiconductor substrate, input nodes of the plurality of main drivers being connected electrically to the second common line. Also, a third common line is formed on the principal plane of the semiconductor substrate, and connected electrically to output nodes of the plurality of main drivers and to the plurality of clock signal supply lines.

In another aspect of the present invention, the clock driver circuit further comprises a clock input driver formed on the principal plane of the semiconductor substrate. An input node of the clock input driver is electrically connected via a clock input line to a clock input pad formed on the principal plane of the semiconductor substrate, and an output node of the clock input driver is electrically connected to the first common line of each of the plurality of basic circuits.

In another aspect of the present invention, in the clock driver circuit, the first through the third common lines are linearly arranged in a first direction on the principal plane of the semiconductor substrate. The plurality of clock signal supply lines are provided parallel to one another, and arranged linearly in a second direction perpendicularly intersecting the first direction on the principal plane of the semiconductor substrate. The plurality of predrivers are arranged in the first direction on the principal plane of the semiconductor substrate. Also, the plurality of main drivers are arranged in the first direction on the principal plane of the semiconductor substrate.

In another aspect of the present invention, in the clock driver circuit, the plurality of predrivers and the plurality of main drivers are provided along a single straight line.

According to another aspect of the present invention, a semiconductor integrated circuit device comprises a plurality of internal circuits, a plurality of clock signal supply lines, and a plurality of basic circuits. The plurality of internal circuits, which require clock signal, are formed on a principal plane of a semiconductor substrate. A plurality of clock signal supply lines are formed linearly in a second direction and in parallel with one another on the principal plane of the semiconductor substrate. The plurality of clock signal supply lines are connected electrically to clock input nodes of predetermined internal circuits among the plurality of internal circuits. Also, a plurality of basic circuits are formed in the second direction on the principal plane of the semiconductor substrate. The plurality of basic circuits each amplifies received clock signals, and supplies the clock signals to the plurality of clock signal supply lines.

Each of the plurality of basic circuits comprises a first common line formed linearly in a first direction perpendicularly intersecting the second direction on the principal plane of the semiconductor substrate. The first common line receives the clock signal. A plurality of predrivers are formed in the first direction, and arranged predetermined distances apart on the principal plane of the semiconductor substrate, input nodes of the plurality of predrivers being connected electrically to the first common line. A second common line is formed linearly in the first direction on the principal plane of the semiconductor substrate, and connected electrically to output nodes of the plurality of predrivers. A plurality of main drivers are formed in the first direction and arranged predetermined distances apart on the principal plane of the semiconductor substrate, input nodes of the plurality of main drivers being connected electrically to the second common line. Also, a third common line is formed linearly in the first direction on the principal plane of the semiconductor substrate, and connected electrically to output nodes of the plurality of main drivers and to the plurality of clock signal supply lines.

In another aspect of the present invention, the semiconductor integrated circuit device further comprises a clock input driver formed on the principal plane of the semiconductor substrate. An input node of the clock input driver is electrically connected via a clock input line to a clock input pad formed on the principal plane of the semiconductor substrate, and an output node of the clock input driver is electrically connected to the first common line of each of the plurality of basic circuits.

In another aspect of the present invention, the semiconductor integrated circuit device further comprises a plurality of clock output lines for electrically connecting the output node of the clock input driver to the first common line associated with the plurality of clock driver circuits, the plurality of clock output lines having the same length.

According to another aspect of the present invention, a semiconductor integrated circuit device comprises a semiconductor substrate having a plurality of macro cell layout regions arranged in a first direction on a principal plane of the substrate. The semiconductor integrated circuit device further comprises a plurality of electrode pairs arranged in a second direction perpendicularly intersecting the first direction in each of the plurality of macro cell layout regions of the semiconductor substrate.

Each of the plurality of macro cell layout regions includes a plurality of N-type diffusion areas each oriented in the second direction and a plurality of P-type diffusion areas each oriented in the second direction, the plurality of N-type diffusion areas and the plurality of P-type diffusion areas being formed collectively in the first direction.

Each of the plurality of electrode pairs is made up of a first and a second electrode. The first electrode is formed together with an interposing insulation film between a contiguous two of the plurality of N-type diffusion areas provided in each of the plurality of macro cell layout regions, and the second electrode is formed together with an interposing insulation film between a contiguous two of the plurality of P-type diffusion areas which are arranged along with the first electrode in the first direction and which are provided in the macro cell layout region in question. Each of the plurality of electrode pairs and the N- and P-type diffusion layers located on both sides of the electrode pair in question constitute a basic cell.

A first macro cell which is made up of a predetermined number of contiguous basic cells and which acts as a logic circuit is provided to each of the plurality of macro cell layout regions on the semiconductor substrate. A second macro cell which is made up of a predetermined number of contiguous basic cells and which acts as an internal circuit requiring a clock signal is provided to each of at least two of the plurality of macro cell layout regions.

Each of the plurality of macro cell layout regions having the second macro cell has a plurality of clock signal supply lines arranged linearly in the second direction and connected electrically to a clock input node of an internal circuit acting as the second macro cell provided to the corresponding macro cell layout region. The plurality of macro cell layout regions on the semiconductor substrate are divided into a plurality of portions in the second direction, each of the divided portions being provided with a basic circuit.

Each of the basic circuits in the corresponding divided portion comprises a plurality of predrivers which are composed of a predetermined number of contiguous basic cells and which are linearly arranged. The plurality of predrivers are provided to each of at least two of the plurality of macro cell layout regions on the semiconductor substrate.

Each of the basic circuits in the corresponding divided portion further comprises a plurality of main drivers (19) which are composed of a predetermined number of contiguous basic cells (8) and which are linearly arranged on a same line with the predrivers. The plurality of main drivers are provided to each of at least two macro cell layout regions other than those provided with the plurality of predrivers on the semiconductor substrate. A first common line is formed linearly in the first direction on the plurality of predrivers and the plurality of main drivers provided to the divided portion in question, the first common line being electrically connected to input nodes of the plurality of predrivers provided to the divided portion in question. A second common line is formed linearly in the first direction on the plurality of predrivers and the plurality of main drivers provided to the corresponding divided portion, the second common line being electrically connected to output nodes of the plurality of predrivers in the corresponding divided portion as well as to input nodes of the plurality of main drivers in the corresponding divided portion. Also, a third common line is formed linearly in the first direction on the plurality of predrivers and the plurality of main drivers provided to the corresponding divided portion, the third common line being electrically connected to output nodes of the plurality of main drivers provided to the corresponding divided portion, the third common line being further connected electrically to the plurality of clock signal supply lines.

In another aspect of the present invention, the semiconductor integrated circuit device further comprises a clock input driver formed on the principal plane of the semiconductor substrate. An input node of the clock input driver is electrically connected via a clock input line to a clock input pad formed on the principal plane of the semiconductor substrate, and an output node of the clock input driver is electrically connected to the first common line of each of the plurality of basic circuits.

In another aspect of the present invention, the semiconductor integrated circuit device further comprises a plurality of clock output lines for electrically connecting the output node of the clock input driver to the first common line, and the plurality of clock output lines have the same length.

In another aspect of the present invention, in the semiconductor integrated circuit device, each of the divided portions comprises at least one power supply line pair composed of a power supply line fed with a supply potential and of a ground line adjacent to and in parallel with the power supply line and fed with a ground potential. The power supply line pair is linearly formed in the first direction on the principal plane of the semiconductor substrate. Also, the plurality of predrivers and the plurality of main drivers in each of the divided portions are located between the power supply line and the ground line constituting the one power supply line pair provided to the corresponding divided portion.

Other features and advantages of the present invention will become more apparent from the following description taken together with the accompanying drawings.

DETAILED DESCRIPTION OF THE PREFERRED EMBODIMENTS

Preferred embodiments of the present invention will hereinafter be described in detail with reference to the accompanying drawings.

First Embodiment

A first embodiment of the present invention will now be described with reference to FIGS. 1 through 8. First described below with reference to FIGS. 1 and 2 are the semiconductor substrate and master chip of a semiconductor integrated circuit device such as a gate array or an embedded cell array comprising a first embodiment of the invention.

Figure 1:
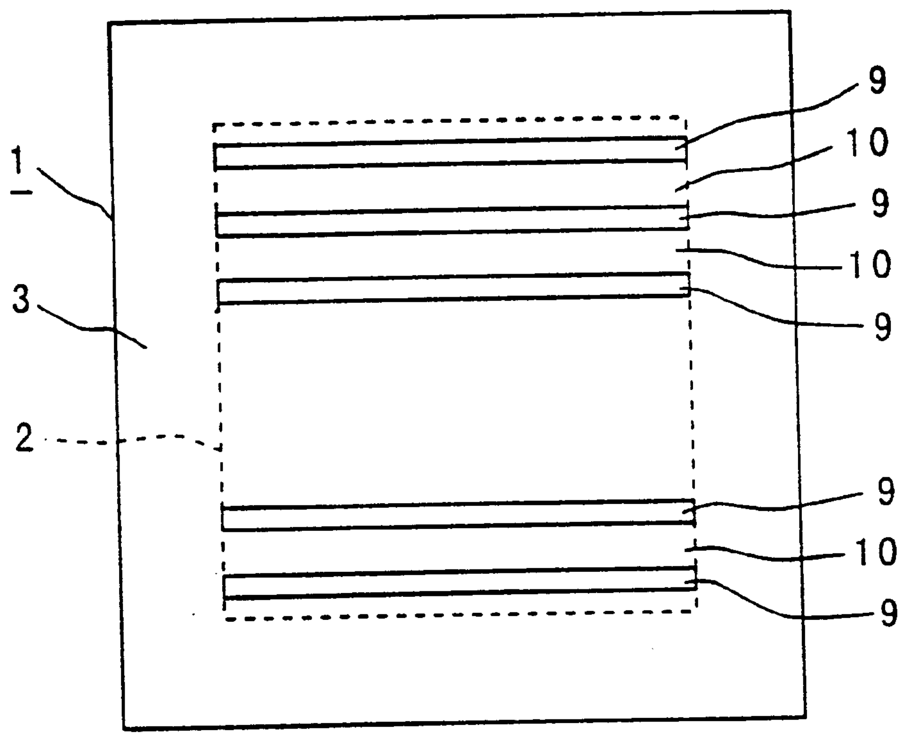
FIG. 1 is a schematic plan view of a master chip used by a semiconductor integrated circuit device embodying the present invention.

In the first embodiment, as shown in FIG. 1, a semiconductor substrate 1 has a cell region (internal region or core region) 2 on a principal plane surrounded by a buffer region (peripheral region) 3. In the cell region 2 on the principal plane of the semiconductor substrate 1, as illustrated in FIG. 2, each first electrode 4 and second electrode 5 oriented in a first direction (longitudinally in the figure) make up an electrode pair, and a plurality of electrode pairs, which form an electrode pair group, are arranged in a second direction (crosswise in the figure). A plurality of electrode pair groups are arranged in the first direction.

Figure 2:
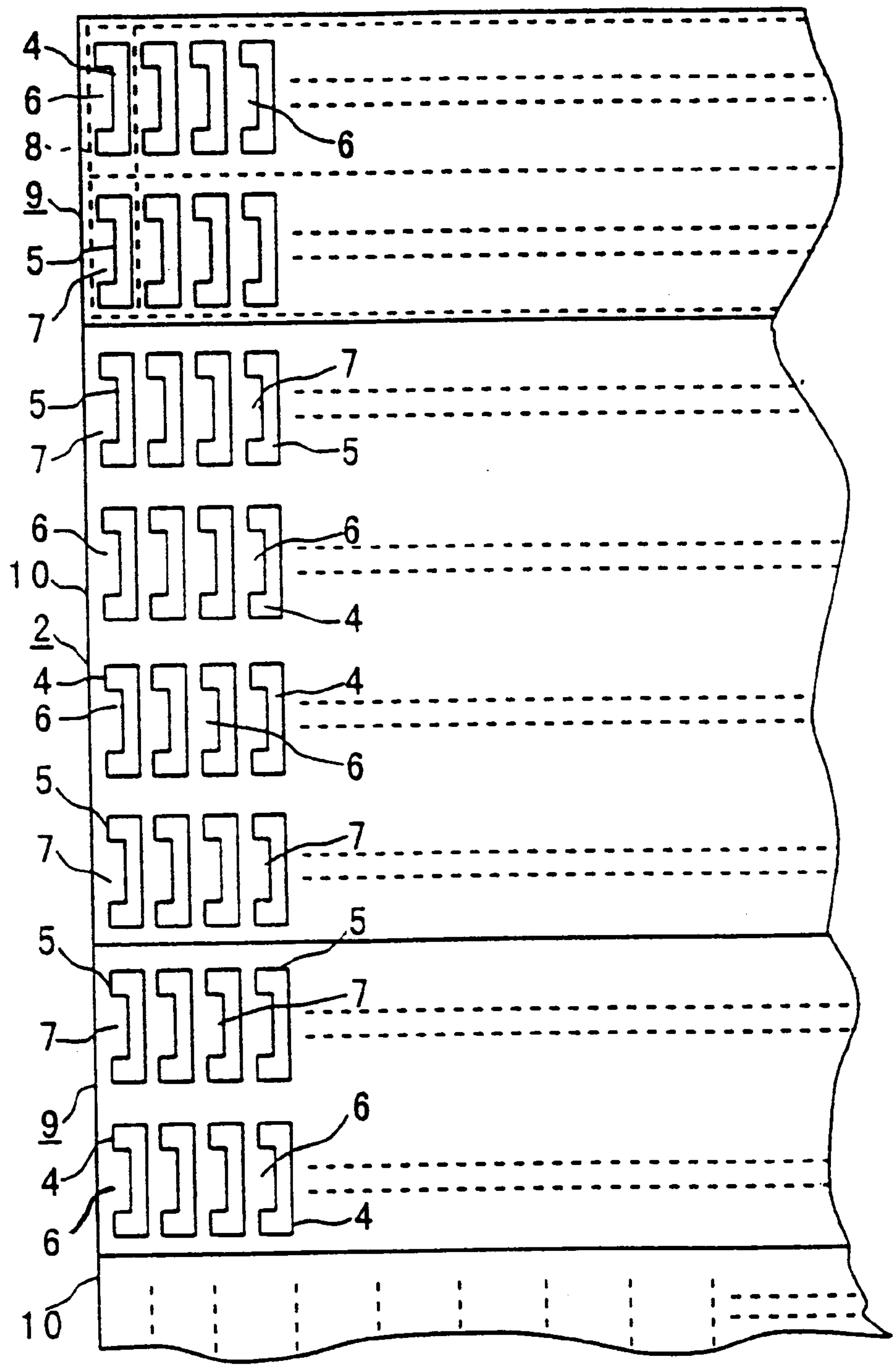
FIG. 2 is a partially enlarged view of the device shown schematically in FIG. 1.

Also in the cell region 2 on the principal plane of the semiconductor substrate 1, as shown in FIG. 2, a plurality of N-type diffusion areas 6 are arranged in the second direction corresponding to the first electrodes 4 of each electrode pair group. In addition, a plurality of P-type diffusion areas 7 are arranged also in the second direction corresponding to the second electrodes 5 of each electrode pair group. Rows of the P-type diffusion areas 7 are formed, along with the N-type diffusion areas 6 corresponding to the areas 7, and arranged alternatively in the first direction.

Each first electrode 4 and the adjacent two N-type diffusion areas 6 constitute an N-type MOS transistor, and each second electrode 5 and the adjacent two P-type diffusion areas 7 make up a P-type MOS transistor. One N-type MOS transistor and one P-type MOS transistor arranged in the first direction constitute a basic cell 8. The region 2 of the semiconductor substrate 1 is filled with basic cells 8 each made up of an N-type and a P-type MOS transistor, which are arranged in the first and the second directions in a matrix fashion. The cell region 2 of the semiconductor substrate 1, when filled with the basic cells, constitute what is known as a master chip.

The logic circuits including AND and/or OR circuits and the internal circuits such as flip-flop circuits each requiring a clock signal are arranged into in a cell structure and composed of predetermined numbers of basic cells. In the description that follows, the logic circuits and the internal circuits in their predetermined numbers are called a first macro cell and a second macro cell, respectively. In the cell region 2 of the semiconductor substrate 1, as shown in FIG. 1, a plurality of macro cell layout regions 9 are provided in the first direction. Every two macro cell layout regions 9 flank one wiring region for electrically interconnecting the macro cells formed in the macro cell layout regions 9.

Each macro cell layout region 9 is made up of a row of basic cells 8 arranged in the second direction. Each wiring region 10 is composed of one or a plurality of rows of basic cells arranged in the second direction depending on the number of lines formed in the second direction. The buffer regions 3 on the semiconductor substrate 1 accommodate circuits including input buffer circuits, output buffer circuits and input/output buffer circuits.

In the semiconductor integrated circuit device of the above constitution, each second macro cell constituting the internal circuits such as flip-flop circuits requiring a clock signal include a clock driver circuit. Clock driver circuits are used to supply the semiconductor integrated circuit device with external clock signals.

Figure 3:
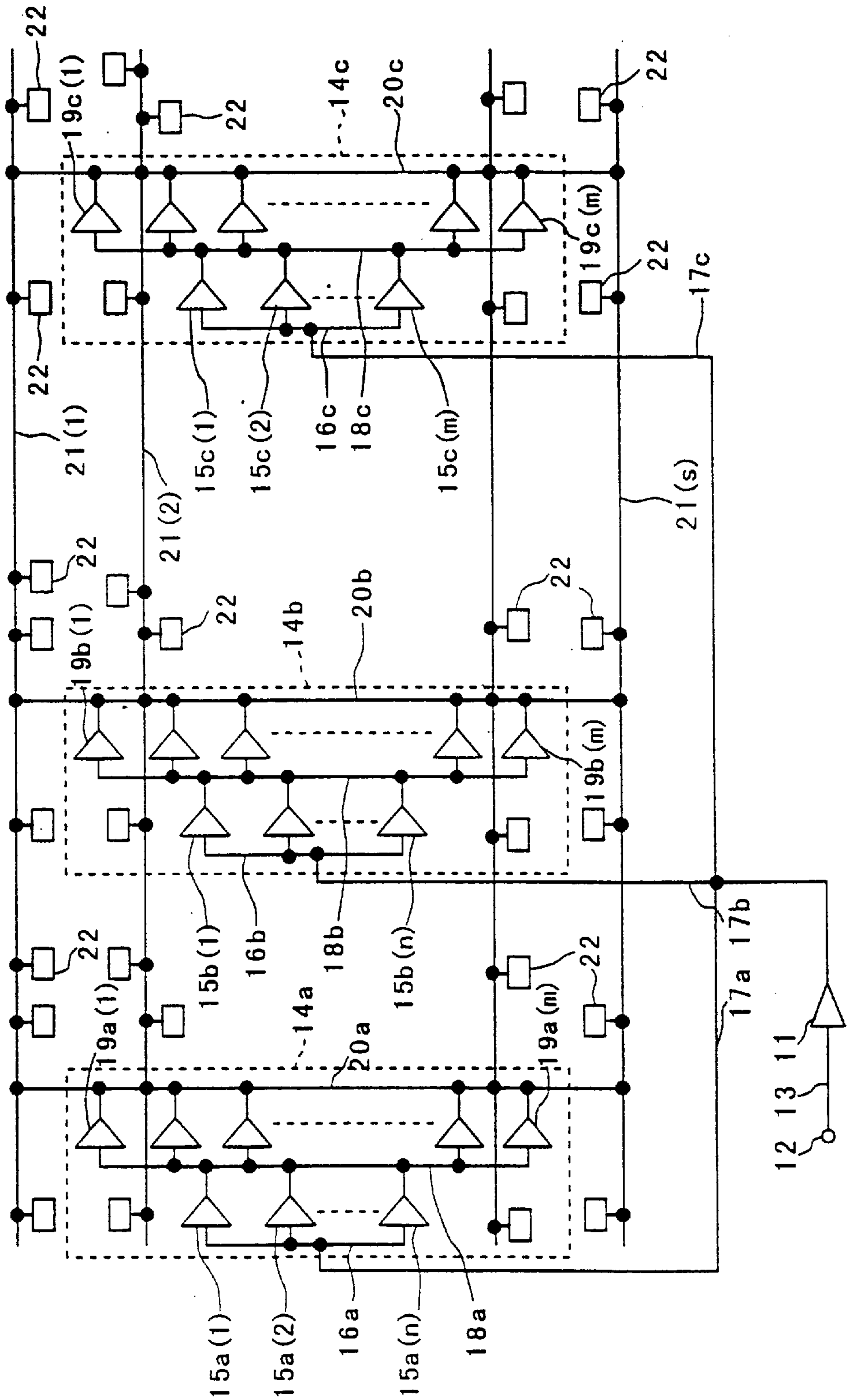
FIG. 3 is a circuit diagram of a first embodiment of the present invention.

Described below with reference to FIG. 3 is a clock driver circuit according to a first embodiment of the present invention. In FIG. 3, a clock input driver 11 has an input node electrically connected to a clock input pad 12 via a clock input line 13. Basic circuits 14*a* through 14*c* amplify received clock signals and supply the clock signals to a plurality of second macro cells 22. Because the basic circuits 14*a* through 14*c* have the same circuit constitution, the description that follows will center on the basic circuit 14*a* as the representative of the three circuits. In this connection, the subscripts a, b and c of the reference numerals are omitted but assumed as they simply identify the individual basic circuits.

Figure 4:
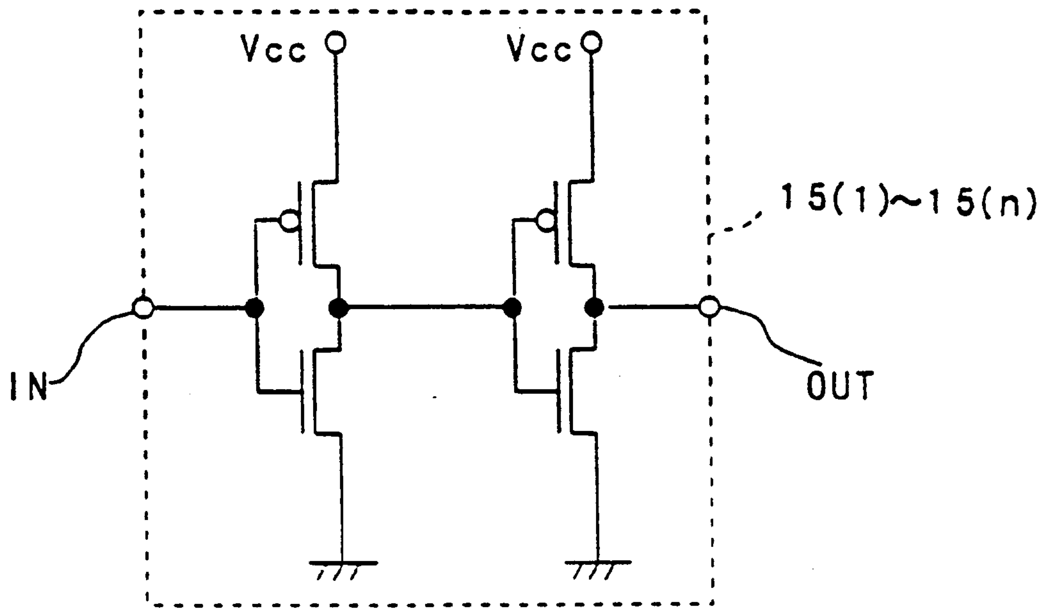
FIG. 4 is a circuit diagram of the predrivers 15(1) through 15(n) shown in FIG. 3.

A plurality of predrivers 15(1) through 15(*n*) have input nodes IN electrically connected to a first common line 16, and output nodes OUT electrically connected to a second common line 18. The first common line 16 is connected electrically to the output node of the clock input driver 11 via a clock output line 17. Illustratively, as shown in FIG. 4, each predriver comprises two cascaded inverter circuits each made of a P-type MOS transistor and an N-type MOS transistor serially connected.

Figure 5:
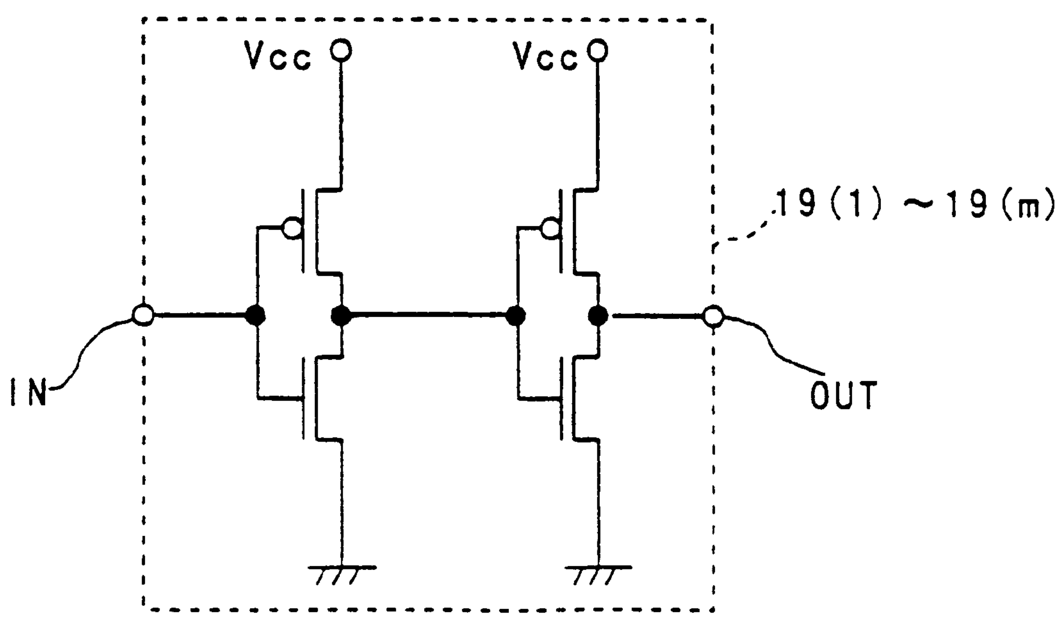
FIG. 5 is a circuit diagram of the main drivers 19(1) through 19*m*shown in FIG. 3.

A plurality of main drivers 19(1) through 19(*m*) have input nodes IN electrically connected to the second common line 18, and output nodes OUT electrically connected to a third common line 20. As shown in FIG. 5, each main driver also illustratively comprises two cascaded inverter circuits each made of a P-type MOS transistor and an N-type MOS transistor serially connected.

Although the predrivers 15(1) through 15(*n*) and the main drivers 19(1) through 19(*m*) are each composed of two cascaded inverter circuits, this arrangement should not be construed as limiting the present invention. Many more inverter circuits may be combined to form each driver. Preferably, however, the number of inverter circuits constituting each predriver and the number of inverter circuits making up each main driver should be an even number when added up. As another alternative, the clock input driver 11 may be composed of two cascaded inverter circuits in the same manner as the predrivers 15(1) through 15(*n*) shown in FIG. 4 and the main drivers 19(1) through (*m*) in FIG. 5.

A plurality of clock signal supply lines 21(1) through 21(*s*) are connected electrically to the clock input nodes of internal circuits (second macro cells) 22 each requiring a clock signal. The clock signal supply lines 21(1) through 21(*s*) are provided along the entire macro cell layout regions 9, and are common to the basic circuits 14*a* through 14*c*. The clock signal supply lines 21(1) through 21(*s*) are connected electrically to third common lines 20*a* through 20*c* of the basic circuits 14*a* through 14*c*.

Figure 6:
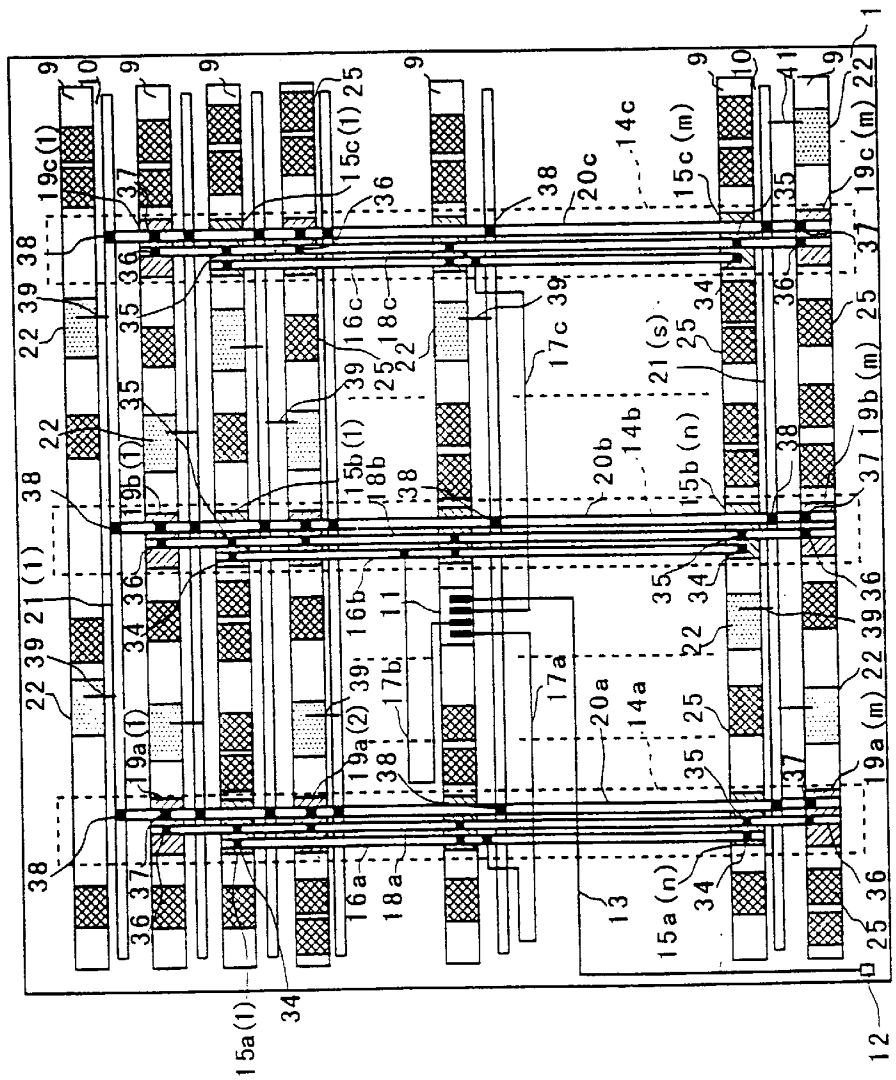
FIG. 6 is a plan pattern view of the first embodiment of the present invention.

Described below with reference to FIG. 6 are the basic circuits 14*a* through 14*c* of which the circuit constitution is shown in FIG. 3 and which form the master chip shown in FIGS. 1 and 2. In FIG. 6, a plurality of macro cell layout regions 9 in the cell region 2 of the semiconductor substrate 1 are divided into a plurality of portions in the second direction (i.e., crosswise in FIG. 6). In the first embodiment, the macro cell layout regions 9 are divided into three portions. Each of the basic circuits 14*a* through 14*c* in FIG. 3 corresponds to each of the divided portions. In other words, the three basic circuits 14*a* through 14*c* are arranged in the second direction.

Because the basic circuits 14*a* through 14*c* have the same circuit constitution, the basic circuit 14*a* alone will be described below as representative of the three circuits. For purpose of simplification and illustration, the subscripts a, b and c of the reference numerals are omitted but assumed. The predrivers 15(1) through 15(*n*) are formed predetermined distances apart, arranged along a single straight line in the first direction, and provided to each of at least two of the plurality of macro cell layout regions 9 (n regions in this configuration). With the first embodiment, the predrivers 15 are disposed in every other macro cell layout region 9. However, this arrangement of distances should not be construed as limiting the invention. The distances between the predrivers 15 may be determined appropriately depending on the number of the predrivers configured.

Figure 7:
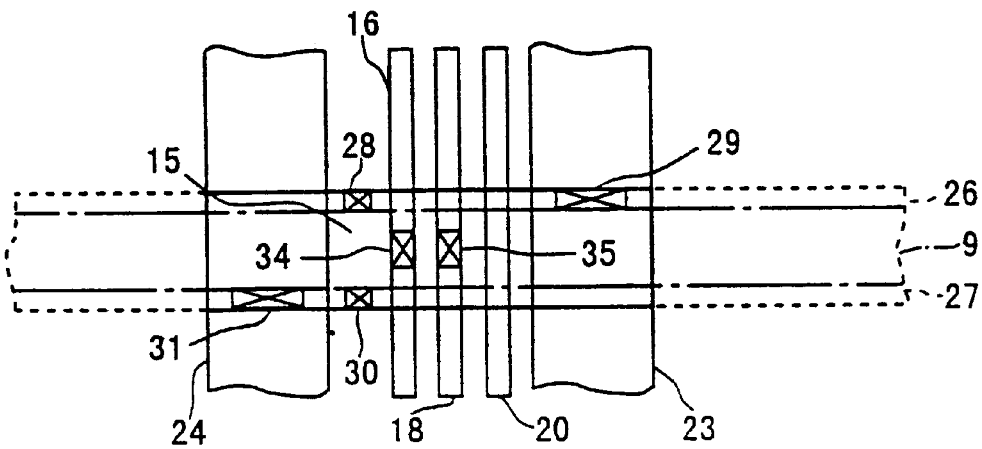
FIG. 7 is a partially enlarged plan pattern view of the predrivers 15(1) through 15(n) shown in FIG. 6.

More specifically, as shown in FIG. 7, each predriver 15 is formed where a power supply pair made of a power supply line 23 and a ground line 24 intersect a macro cell layout region 9, i.e., each predriver is formed in the macro cell layout region 9 between the power supply line 23 and ground line 24 constituting a power supply line pair.

The power supply line 23 is fed with the supply potential, and the ground line 24 is connected to ground potential. The power supply line 23 and ground line 24 making up each power supply line pair are formed contiguous to and in parallel with each other, and are constituted by the second electrical conductor layer. In the first embodiment, the distance between the outer periphery of the power supply line 23 and that of the ground line 24 making up each power supply line pair is 46 BC (where BC denotes "Basic Cells", and where one basic cell represents the width of a basic cell in the second direction, i.e. 2.65 μm in one exemplary embodiment). This means that each predriver 15 may be readily formed between the power supply line 23 and ground line 24.

Although FIG. 6 omits for purpose of simplification the power supply line pairs each composed of the power supply line 23 and its paired ground line 24, the power supply line pairs of the first embodiment are actually arranged linearly and predetermined distances apart (e.g. 210 BC) across the cell region 2 in the first direction on the principal plane of the semiconductor substrate 1. Because the cell region 2 on the semiconductor substrate 1 in the first embodiment extends 9 mm in the second direction, each divided portion is provided with a plurality of power supply line pairs.

As with the wiring inside the logic circuits acting as the first macro cell 25, wiring inside the internal circuits acting as the second macro cell 22, wiring between the logic circuits, and wiring between the logic circuits on the one hand and the internal circuits on the other, the wiring inside each predriver 15 is constituted by at least one of first and second wiring. The first wiring is arranged linearly in the second direction, and the second wiring is formed linearly in the first direction. The first wiring is made of a first electrical conductor layer formed together with an interposing interlayer insulation film over the electrode pairs constituting the basic cells 8. The second wiring is made of a second electrical conductor layer formed together with an interposing interlayer insulation film over the first electrical conductor layer. The first and the second electrical conductor layers may switch their positions vertically. The first and the second electrical conductor layers are constituted by aluminum layers including an aluminum alloy layer, or like material.

In FIG. 7, the length of the predriver 15 in the second direction is shown ranging from the outer periphery of the power supply line 23 to that of the paired ground line 24. However, this arrangement should not be construed as limiting the invention. Depending on its structure, the predriver 15 may alternatively be shorter than the distance between the outer periphery of the power supply line 23 and that of the paired ground line 24, as long as each predriver 15 is located between the power supply line 23 and the paired ground line 24 constituting each power supply line pair.

As illustrated in FIG. 7, each predriver 15 is fed with the supply potential Vcc from the power supply line 23 via another power supply line 26. The predriver 15 is also supplied with the ground potential GND from the ground line 24 connected to the driver via another ground line 27. The power supply lines 26 are provided substantially entirely over the macro cell layout regions 9 in the second direction on one side of the regions (top side in FIG. 7). The power supply lines 26 are formed by the first electrical conductor layer, and are connected electrically to the predrivers 15 via contact holes 28 as well as to the power supply lines 23 via contact holes 29. The ground lines 27 are provided substantially entirely over the macro cell layout regions 9 in the second direction on another side of the regions (bottom side in FIG. 7). The ground lines 27 are formed by the first electrical conductor layer, and are connected electrically to the predrivers 15 via contact holes 30 as well as to the ground lines 24 via contact holes 31.

The main drivers 19(1) through **19(*m*) are formed predetermined distances apart along a single straight line in the first direction, and are provided to each of at least two (as many as m in this embodiment) macro cell layout regions 9 other than those in which the predrivers 15(1) through 15(*n*) are formed. In the first embodiment, the distances are set to correspond to every other macro cell layout region. In other words, the main drivers 19 and predrivers 15 are arranged alternately along a single straight line in the first direction. However, this arrangement should not be construed as limiting the invention. The driver arrangement may be varied depending on the number of the main drivers 19** incorporated.

Figure 8:
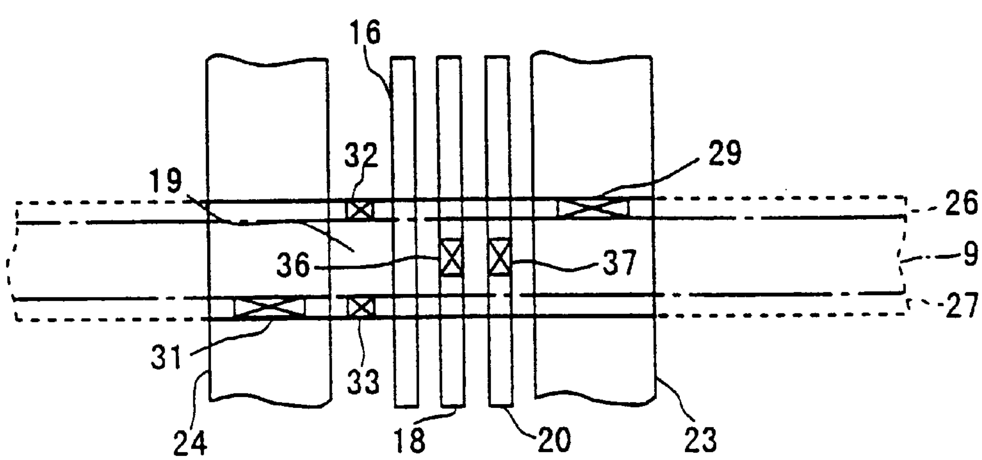
FIG. 8 is a partially enlarged plan pattern view of the main drivers 19(1) through 19*m*shown in FIG. 6.

As shown in more detail in FIG. 8, each main driver 19 is formed where each power supply line pair made of the power supply line 23 and ground line 24 intersects the macro cell layout region 9, i.e., each main driver is formed in the macro cell layout region 9 between the power supply line 23 and ground line 24 constituting each power supply line pair.

As in the case of predrivers 15, the wiring inside each main driver 19 is formed by at least one of first and second wirings. The first wiring is formed linearly in the second direction, and the second wiring is arranged linearly in the first direction. Each main driver 19 may be readily formed between a power supply line 23 and its paired ground line 24. In FIG. 8, the length of each main driver 19 in the second direction is shown ranging from the outer periphery of a power supply line 23 to that of its paired ground line 24. However, this arrangement should not be construed as limiting the invention. Depending on its structure, the main driver 19 may alternatively be shorter than the distance between the outer periphery of the power supply line 23 and that of the paired ground line 24, as long as each main driver 19 is located between the power supply line 23 and the paired ground line 24 constituting the power supply line pair.

As illustrated in FIG. 8, each main driver 19 is fed with the supply potential Vcc from the power supply line 23 via another power supply line 26. The main driver 19 is also supplied with the ground potential GND from the ground line 24 connected to the driver via another ground line 27. The power supply lines 26 are connected electrically to the main drivers 19 via contact holes 32 as well as to the power supply lines 23 via contact holes 29. The ground lines 27 are connected electrically to the main drivers 19 via contact holes 33 as well as to the ground lines 24 via contact holes 31.

As shown in FIGS. 6 and 7, the first common line 16 is arranged linearly in the first direction over a plurality of predrivers 15(1) through **15(*n*) and a plurality of main drivers 19(1) through 19(*m*). The first common line 16 is formed by the second electrical conductor layer, and is located between the power supply line 23 and the paired ground line 24 making up each power supply line and in parallel with the paired lines. The first common line 16 is connected electrically to the input nodes of the predrivers 15(1) through 15(*n*) via contact holes 34** so as to short-circuit these nodes.

As depicted in FIGS. 6 through 8, the second common line 18 is arranged linearly in the first direction over the plurality of predrivers 15(1) through **15(*n*) and the plurality of main drivers 19(1) through 19(*m*). The second common line 18 is formed by the second electrical conductor layer, and is located between the power supply line 23 and ground line 24 making up each power supply line and in parallel with the first common line 16. The second common line 18 is connected electrically to the output nodes of the predrivers 15(1) through 15**(*n*) via contact holes 35, as well as to the input nodes of the main drivers 19(1) through 19(*m*) via contact holes 36, thereby short-circuiting the output nodes of the predrivers and the input nodes of the main drivers.

As illustrated in FIGS. 6 and 8, the third common line 20 is also arranged linearly in the first direction over the plurality of predrivers 15(1) through 15(*n*) and the plurality of main drivers 19(1) through 19(*m*). The third common line 20 is formed by the second electrical conductor layer, and is located between the power supply line 23 and ground line 24 making up each power supply line and in parallel with the first common line 16. The third common line 20 is connected electrically to the output nodes of the main drivers 19(1) through 19(*m*) via contact holes 37 so as to short-circuit these nodes.

The third common line 20 is greater in line width than the first and second common lines 16 and 18. The reason for the enlarged width of the third common line 20 is as follows. The first common line 16 is connected to the input nodes of the plurality of predrivers 15(1) through 15(*n*). As shown in FIG. 4, the input nodes IN are connected to the gate electrodes of P-type and N-type MOS transistors. Thus the load capacity connected to the first common line 16 is small. The second common line 18 is connected to the input nodes of the plurality of main drivers 19(1) through 19(*m*). As illustrated in FIG. 5, the input nodes IN are also connected to the gate electrodes of P-type and N-type MOS transistors. Thus the load capacity connected to the second common line 18 is also small. By contrast, the third common line 20 is connected to the plurality of clock signal supply lines 21(1) through 21(*s*) as well as to the clock input nodes of the plurality of internal circuits 22. This means that the load capacity connected to the third common line 20 is large. Furthermore, the second common line 18 is made greater in line width than the first common line 16 depending on the different connected load capacities.

The basic circuit 14*a* is located in the middle of the left-hand one-third divided portion of FIG. 6 in the second direction. That is, the predrivers 15*a*(1) through 15*a*(*n*) and the main drivers 19*a*(1) through 19*a*(*m*) are located in the macro cell layout region between the power supply line 23 and the paired ground line 24 constituting the power supply line pair arranged in the second direction and located in the middle of the corresponding divided portion. The first through the third common lines 16*a*, 18*a* and 20*a* are located between the power supply line 23 and the paired ground line 24 making up the power supply line pair arranged in the second direction and located in the middle of the corresponding divided portion.

The basic circuit 14*b* is located in the middle of the central one-third divided portion of FIG. 6 in the second direction. That is, the predrivers 15*b*(1) through 15*b*(*n*) and the main drivers 19*b*(1) through 19*b*(*m*) are located in the macro cell layout region between the power supply line 23 and the paired ground line 24 constituting the power supply line pair arranged in the second direction and located in the middle of the corresponding divided portion. The first through the third common lines 16*b*, 18*b* and 20*b* are located between the power supply line 23 and the paired ground line 24 making up the power supply line pair arranged in the second direction and located in the middle of the corresponding divided portion.

The basic circuit 14*c* is located in the middle of the right-hand one-third divided portion of FIG. 6 in the second direction. That is, the predrivers 15*c*(1) through 15*c*(*n*) and the main drivers 19*c*(1) through 19*c*(*m*) are located in the macro cell layout region between the power supply line 23 and the paired ground line 24 constituting the power supply line pair arranged in the second direction and located in the middle of the corresponding divided portion. The first through the third common lines 16*c*, 18*c* and 20*c* are located between the power supply line 23 and the paired ground line 24 making up the power supply line pair arranged in the second direction and located in the middle of the corresponding divided portion. Although the first embodiment has been shown incorporating three basic circuits 14*a* through 14*c*, this arrangement should not be construed as limiting the invention. More basic circuits may be incorporated.

As shown in FIG. 6, the plurality of clock signal supply lines 21(1) through 21(*s*) are arranged linearly in the second direction corresponding to the plurality of macro cell layout regions 9 in which the second macro cells 22 are located. The clock signal supply lines 21(1) through 21(*s*) are provided commonly to the first through the third basic circuits 14*a* through 14*c* and are formed, in the first embodiment, along the entire span of the corresponding macro cell layout regions 9. With the first embodiment, one clock signal supply line 21 is provided to every one of the macro cell layout regions 9. Alternatively, one clock signal supply line 21 may be provided to every contiguous two of the macro cell layout regions 9. As another alternative, the clock signal supply lines 21 may be provided to only those macro cell layout regions 9 where the second macro cells 22 are located. In the latter case, if one second macro cell 22 is provided to every contiguous two of the macro cell layout regions 9, every two contiguous macro cell layout regions may be provided with one clock signal supply line 21.

The clock signal supply lines 21(1) through 21(*s*) are formed by the first electrical conductor layer and arranged in parallel fashion to one another in the wiring regions 10. The clock signal supply lines 21(1) through 21(*s*) are connected electrically to the third common lines 20*a* through 20*c* via contact holes 38 where the first through the third basic circuits 14*a* through 14*c* intersect the clock signal supply lines 21(1) through 21(*s*). The clock signal supply lines 21(1) through 21(*s*) are also connected via wiring 39 to the clock input nodes of the internal circuits working as second macro cells 22 in the corresponding macro cell layout regions 9. The wiring 39 is formed by the second electrical conductor layer.

In FIG. 6, the first macro cells 25 acting as logic circuits and the second macro cells 22 working as internal circuits requiring clock signals are shown randomly for purpose of simplification and illustration. In practice, the first and second macro cells 25 and 22 are formed close to one another all over the macro cell layout regions 9 except the areas between the power supply line 23 and ground line 24 constituting each power supply line pair. There exists insulating regions between the macro cells, generally with one basic cell ensuring electrical insulation between every two macro cells.

As illustrated in FIG. 6, the clock input driver 11 is arranged in the second direction and located in the middle of a macro cell layout region 9, which in turn is arranged in the first direction and located in the middle of a plurality of macro cell layout regions 9. In the first embodiment, the clock input driver 11 is located between the power supply line 23 and the paired ground line 24 constituting the power supply line pair next to the power supply line pair to which the second basic circuit 14*b* is provided. The input node of the clock input driver 11 is connected electrically via the clock input line 13 to the clock input pad 12 formed on the principal plane of the semiconductor substrate 1. The clock input line 13 is formed by first and second wiring. The first wiring is made of the first electrical conductor layer and extends in the second direction, and the second wiring is constituted by the second electrical conductor layer and extends in the first direction.

The output node of the clock input driver 11 is electrically connected to the first common lines 16*a* through 16*c* via clock output lines 17*a* through 17*c*. The clock output line 17*a* is formed by first and second wiring, the first wiring being made of the first electrical conductor layer and extending in the second direction, the second wiring being composed of the second electrical conductor layer and extending in the first direction. One end of the clock output line 17*a* is electrically connected to the output node of the clock input driver 11, and the other end of the line 17*a* is electrically connected to the middle of the first common line 16*a*. The clock output line 17*b* is formed by first and second wiring, the first wiring being constituted by the first electrical conductor layer and extending in the second direction, the second wiring being made of the second electrical conductor layer and extending in the first direction. One end of the clock output line 17*b* is electrically connected to the output node of the clock input driver 11, and the other end of the line 17*b* is electrically connected to the middle of the first common line 16*b*.

The clock output line 17*c* is also formed by first and second wiring, the first wiring being made of the first electrical conductor layer and extending in the second direction, the second wiring being composed of the second electrical conductor layer and extending in the first direction. One end of the clock output line 17*c* is electrically connected to the output node of the clock input driver 11, and the other end of the line 17*c* is electrically connected to the middle of the first common line 16*c*. The clock output lines 17*a* through 17*c* are all designed to have the same length, with the first and second wiring appropriately arranged with respect to a reference wiring length ranging from the clock input driver 11 to the farthest first common line.

What follows is a description of how the semiconductor integrated circuit device of the above-described embodiment works from the time a clock signal is input to the clock input pad 12 until the clock signal enters the clock input nodes of internal circuits acting as second macro cells 22. When a clock signal is input from the outside to the clock input pad 12, the input clock signal is forwarded to the clock input driver 11 via the clock input line 13. The clock input driver 11 outputs a clock signal based on the input clock signal. The clock signal thus output is fed via the clock output lines 17*a* through 17*c* to the first common lines 16*a* through 16*c*, reaching predrivers 15*a*(1) through 15*a*(*n*), 15*b*(1) through 15*b*(*n*) and 15*c*(1) through 15*c*(*n*).

Because the clock output lines 17*a* through 17*c* have the same wiring length, changes in the clock signal (i.e., rise and fall) are the same on the first common lines 16*a* through 16*c*. In addition, the input nodes of the predrivers 15*a*(1) through 15*a*(*n*), 15*b*(1) through 15*b*(*n*) and 15*c*(1) through 15*c*(*n*) are short-circuited respectively by the first common lines 16*a* through 16*c*, and the load capacity of the predrivers is small with respect to the first common lines 16*a* through 16*c*. For these reasons, the input nodes of the predrivers 15*a*(1) through 15*a*(*n*), 15*b*(1) through 15*b*(*n*) and 15*c*(1) through 15*c*(*n*) develop the same changes in the clock signal.

The changes in the clock signal are the same on the output nodes of the predrivers 15*a*(1) through 15*a*(*n*), 15*b*(1) through 15*b*(*n*) and 15*c*(1) through 15*c*(*n*). Furthermore, the entire spans of the second common lines 18*a* through 18*c* are connected in a distributed manner to the output nodes of the predrivers 15*a*(1) through 15*a*(*n*), 15*b*(1) through 15*b*(*n*) and 15*c*(1) through 15*c*(n) which are arranged predetermined distances apart. This causes the clock signal appearing on each of the second common lines 18*a* through 18*c* to change in the same fashion along the entire second common lines 18*a* through 18*c*. The same applies to the changes in the clock signal appearing on the output nodes of the main drivers 19*a*(1) through 19*a*(*m*), 19*b*(1) through 19*b*(*m*) and 19*c*(1) through 19*c*(*m*) whose input nodes are short-circuited by the second common lines 18*a* through 18*c*.

The output nodes of the main drivers 19*a*(1) through 19*a*(*m*), 19*b*(1) through 19*b*(*m*) and 19*c*(1) through 19*c*(*m*) are arranged predetermined distances apart and connected in a distributed manner to the entire spans of the third common lines 20*a* through 20*c*. This causes the changes in the clock signal appearing on the third common lines 20*a* through 20*c* to be the same along their entire spans. In short, the changes in the clock signal input to the clock input pad 12 remain the same all along the third common lines 20*a* through 20*c*. In other words, there is a very limited presence of clock skews, i.e., temporal discrepancies for the clock signal having entered the clock input pad 12 to reach the third common lines 20*a* through 20*c* along their entire spans.

The clock signal transmitted to the third common lines 20*a* through 20*c* is supplied via clock signal supply lines 21(1) through 21(*s*) to the clock input nodes of the internal circuits (second macro cells 22) each requiring a clock signal. In this case, the changes in the clock signal are the same at the points of connection between the clock signal supply lines 21(1) through 21(*s*) on the one hand, and the third common lines 20*a* through 20*c* on the other hand, because the clock signal supply lines 21(1) through 21(*s*) are electrically connected to contact holes 38 where the lines 21(1) through 21(*s*) intersect the third common lines 20*a* through 20*c* of the first through the third basic circuits 14*a* through 14*c*. With the first embodiment, however, the changes in the clock signal at the farthest points from the points of connection with the first through the third common lines 20*a* through 20*c* lag slightly behind the signal changes at those points of connection with the third common lines 20*a* through 20*c*. These farthest points include both ends of the clock signal supply lines 21(1) through 21(*s*), the middle point between the third common line 20*a* of the first basic circuit 14*a* and the third common line 20*b* of the second basic circuit 14*b*, and the middle point between the third common line 20*b* of the second basic circuit 14*b* and the third common line 20*c* of the third basic circuit 14*c*.

Each of the signal supply lines 21(1) through 21(*s*) extend to right side and left side in the second direction by one sixth of the length of the macro cell layout region 9 from the points of connection between the clock signal supply lines 21(1) through 21(*s*) and the third common lines 20*a* through 20*c*. In other words, the maximum distance ranging from any of the points of connection with the third common lines 20*a* through 20*c* to the corresponding internal circuit 22 is one sixth of the length of the clock signal supply lines 21(1) through 21(*s*). This arrangement achieves very limited delays of change in the most lagging clock signal with respect to the clock signal change at the points of connection with the third common lines 20*a* through 20*c*. In short, clock skews are minimized regarding all the second macro cells 22.

As described above, the first embodiment of the invention offers the following major benefits.

(A) The changes in the clock signal input to the clock input pad 12 occur in the same manner along the entire spans of the third common lines 20*a* through 20*c*. There are very small time delays attributable to the presence of the clock signal supply lines 21(1) through 21(*s*). This minimizes any clock skews occurring between clock signals fed to all the second macro cells 22 working as the internal circuits each requiring a clock signal.

(B) The plurality of predrivers 15*a*(1) through 15*a*(*n*), 15*b*(1) through 15*b*(*n*) and 15*c*(1) through 15*c*(*n*) and the plurality of main drivers 19*a*(1) through 19*a*(*m*), 19*b*(1) through 19*b*(*m*) and 19*c*(1) through 19*c*(*m*) constituting the basic circuits 14*a* through 14*c* are located between the power supply line 23 and the paired ground line 24 making up each power supply line pair in which neither the first macro cell 25 nor the second macro cell 22 is provided. This arrangement places the basic circuits 14*a* through 14*c* within the cell region 2 without decreasing the number of first and second macro cells 25 and 22 to be provided in that region.

(C) The clock input line 13, clock output lines 17*a* through 17*c*, the first through the third common lines 16*a* through 16*c*, 18*a* through 18*c* and 20*a* through 20*c*, and clock signal supply lines 21(1) through 21(*s*) may be designed to be very small in line width. This also minimizes clock skews regarding all the second macro cells 22. Because of the reduced total wiring area occupied by the clock input line 13, clock output lines 17*a* through 17*c*, the first through the third common lines 16*a* through 16*c*, 18*a* through 18*c* and 20*a* through 20*c*, and clock signal supply lines 21(1) through 21(*s*), the wiring capacity is also decreased. This in turn lowers power dissipation by the basic circuits 14*a* through 14*c*.

(D) The first through the third basic circuits 14*a* through 14*c* are designed to be identical in circuit constitution. Any lopsided extension of the cell region 2 in the second direction is thus matched with the addition of an appropriate number of basic circuits each having the same constitution. This provides a variety of semiconductor integrated circuit devices having equivalent clock skews.

(E) Where the second macro cells 22 are provided not in an evenly distributed manner but in a lopsided concentrated fashion in the cell region 2, the locations congested with the second macro cells 22 may be provided with a plurality of basic circuits having the same circuit constitution. This arrangement alleviates the capacity loads of the second macro cells 22 on each of the basic circuits, thereby minimizing any clock skews occurring between clock signals fed to all the second macro cells 22.

In the first embodiment above, the input node of the clock input driver 11 is connected to the input pad 12 via the clock input line 13. Alternatively, a PLL circuit may be interposed between the input node of the clock input driver 11 and the input pad 12 to stabilize the clock signal entering the clock input driver 11.

Second Embodiment

Figure 9:
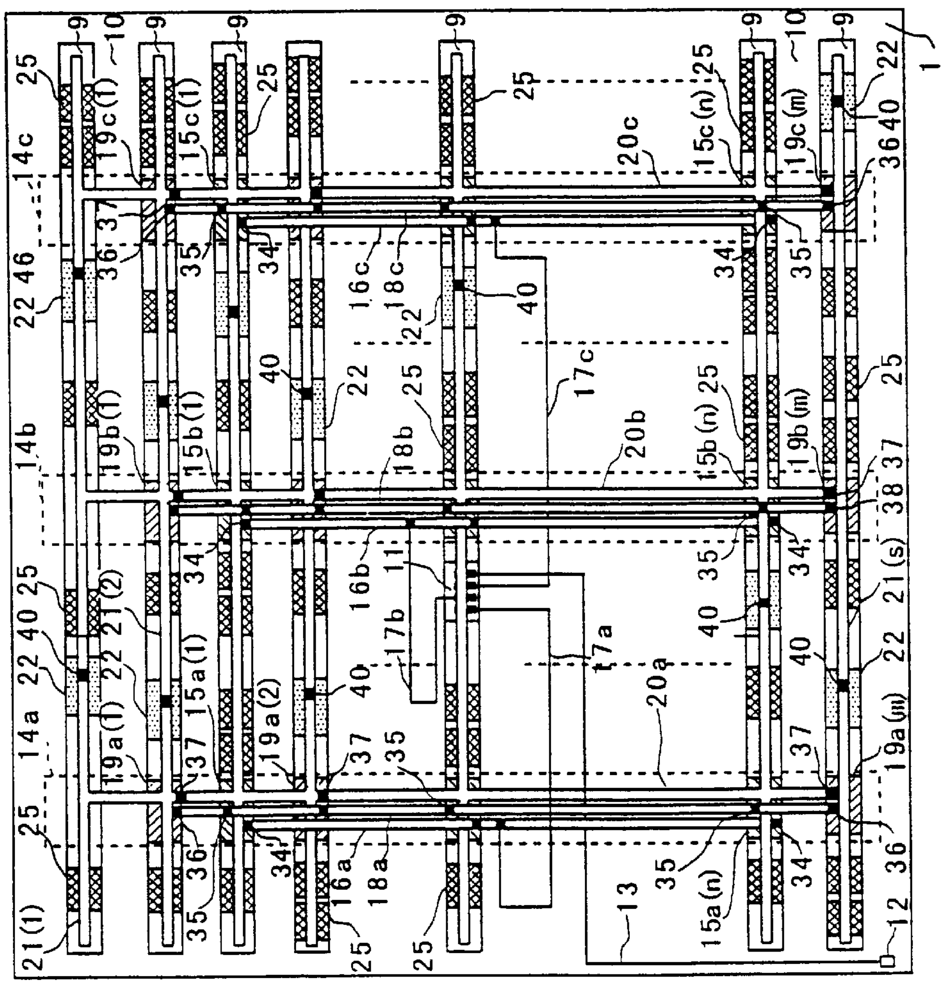
FIG. 9 is a plan pattern view of a second embodiment of the present invention.
Figure 10:
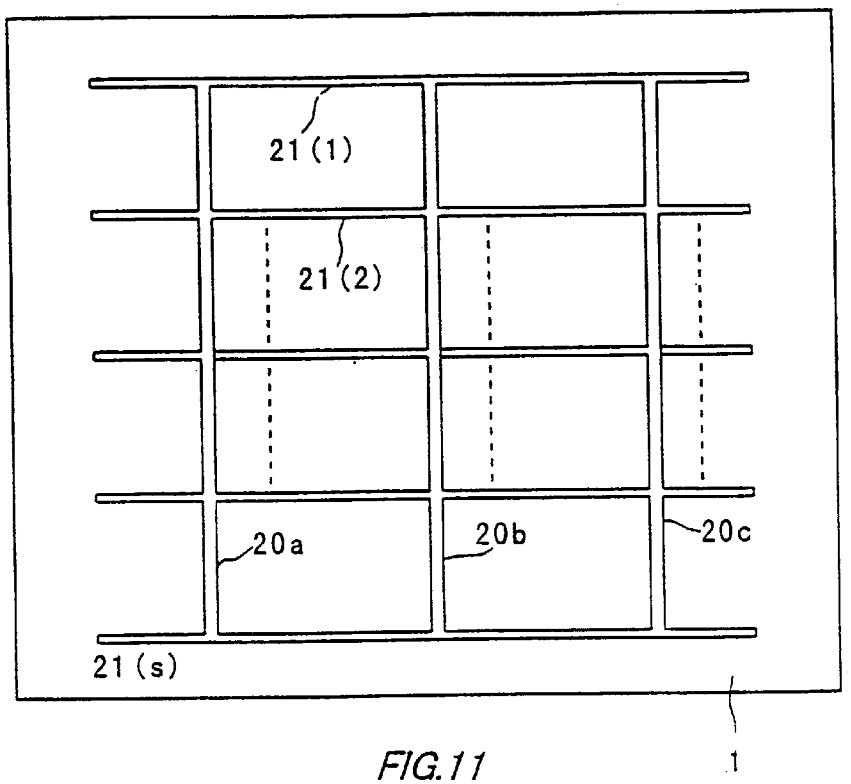
FIG. 10 is a plan pattern view of the third common lines 20*a* through 20*c* as well as the clock signal supply lines 21(1) through 21(s) shown in FIG. 9.
Figure 11:
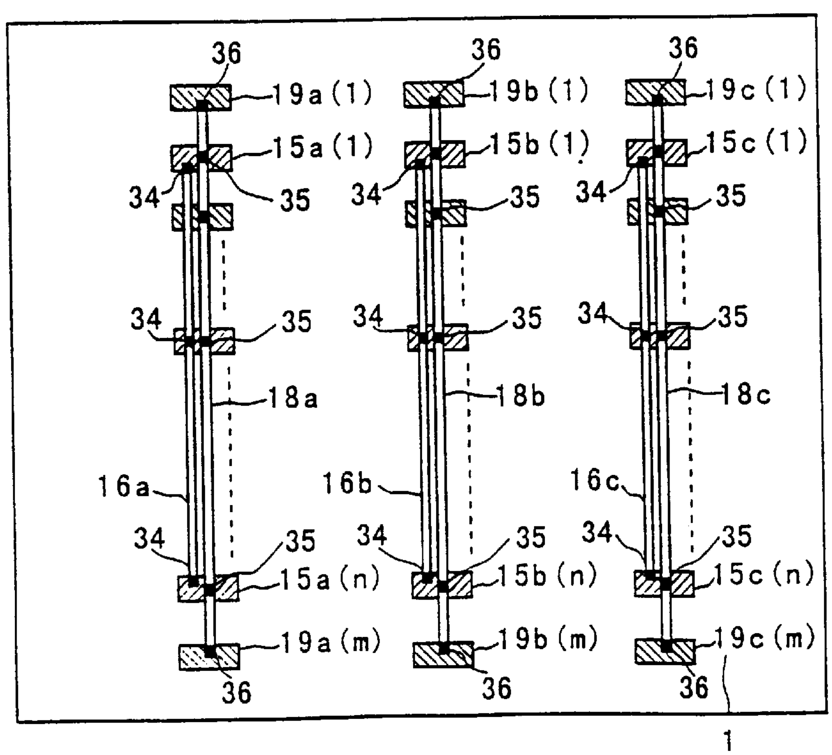
FIG. 11 is a plan pattern view of the first common lines 16*a* through 16*c* and the second common lines 18*a* through 18*c* shown in FIG. 9.
Figure 12:
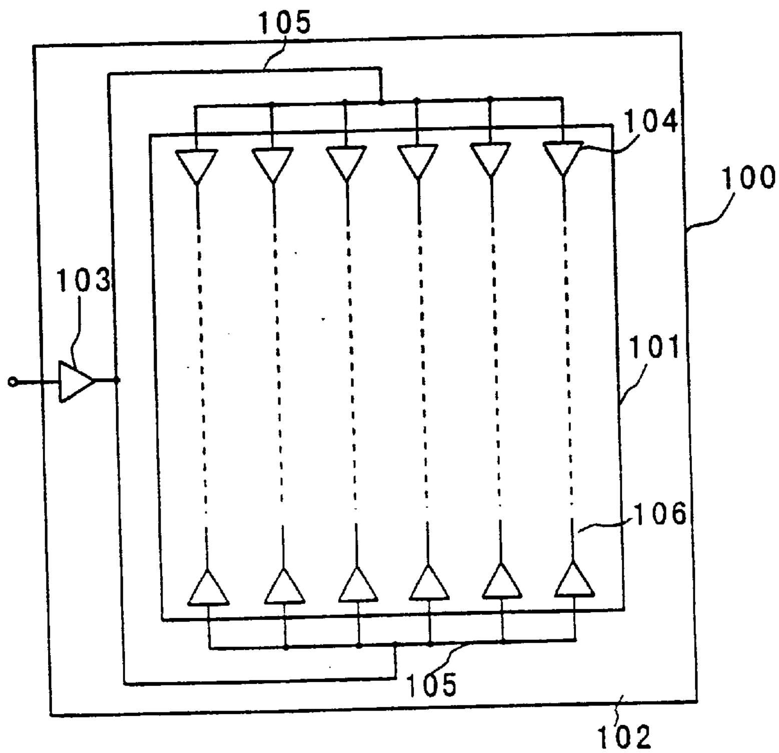
FIG. 12 is a plan pattern view of a conventional semiconductor integrated circuit device.
Figure 13:
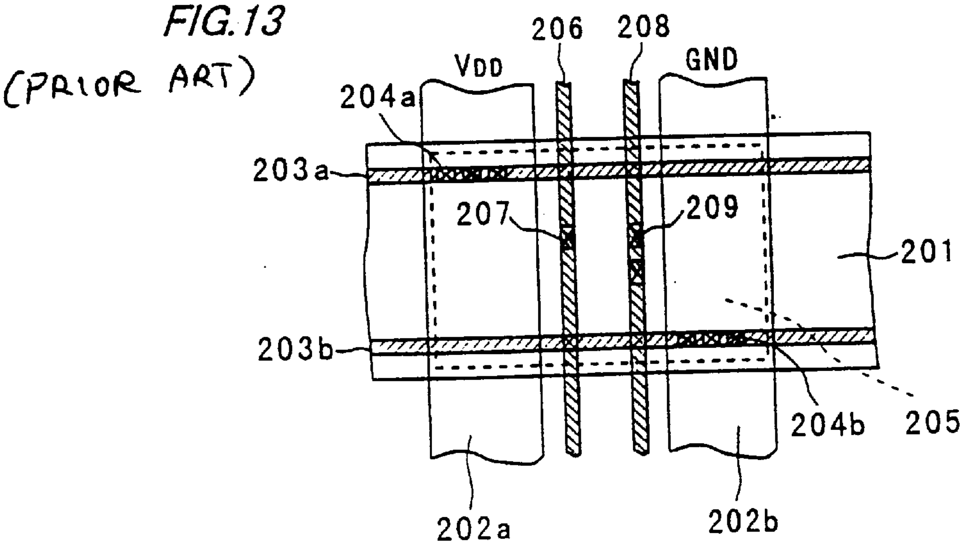
FIG. 13 is a partial plan pattern view of another conventional semiconductor integrated circuit device.

FIGS. 9 through 11 are plan pattern views of a clock driver circuit according to a second embodiment of the present invention. The second embodiment is basically the same in structure as the first embodiment with the exception of the following points. Whereas the first embodiment has the first through the third common lines 16*a* through 16*c*, 18*a* through 18*c* and 20*a* through 20*c* formed by the second electrical conductor layer and has the clock signal supply lines 21(1) through 21(*s*) made of the first electrical conductor layer, the second embodiment comprises a third and a fourth electrical conductor layer different from the first and the second electrical conductor layers. In the second embodiment, the third common lines 20*a* through 20*c* and the clock signal supply lines 21(1) through 21(*s*) are integrally formed by the third electrical conductor layer as shown in FIG. 10, and the first and the second common lines 16*a* through 16*c* and 18*a* through 18*c* are formed by the fourth electrical conductor layer as illustrated in FIG. 11.

The third electrical conductor layer is formed together with an interposing interlayer insulation film over the second electrical conductor layer. The fourth electrical conductor layer is formed together with an interposing interlayer insulation film over the third electrical conductor layer. The third and the fourth electrical conductor layers may switch their positions vertically. The third and the fourth electrical conductor layers are constituted by aluminum layers including an aluminum alloy layer.

The first through the third common lines 16*a* through 16*c*, 18*a* through 18*c* and 20*a* through 20*c* formed by the third or the fourth electrical conductor layer are located above the predrivers 15(1) through 15(*n*) and main drivers 19(1) through 19(*m*) of the corresponding basic circuits 14*a* through 14*c*, and are arranged linearly in the first direction between the power supply line 23 and the paired ground line 24 constituting each power supply line pair, as in the case of the first embodiment. The first through the third common lines 16*a* through 16*c*, 18*a* through 18*c* and 20*a* through 20*c* are electrically connected to the predrivers 15(1) through 15(*n*) and main drivers 19(1) through 19(*m*) of the corresponding basic circuits 14*a* through 14*c* by way of the contact holes 34 through 37, as with the first embodiment.

The plurality of clock signal supply lines 21(1) through 21(*s*) correspond respectively to a plurality of macro cell layout regions 9 in which second macro cells 22 are each provided, and are arranged linearly in the second direction immediately above the corresponding macro cell layout regions. The clock signal supply lines 21(1) through 21(*s*) are connected via contact holes 40 to the clock input nodes of the internal circuits working as the second macro cells 22 in the corresponding macro cell layout regions 9. In FIGS. 9 through 11, the reference numerals already used in conjunction with the first embodiment designate like or corresponding parts.

The above semiconductor integrated circuit device practiced as the second embodiment of the invention provides the same benefits as those (A) through (E) of the first embodiment and supplements them with further advantages as follows.

(F) Because the clock signal supply lines 21(1) through 21(*s*) are located immediately above the corresponding macro cell layout regions 9, the wiring regions 10 may be utilized efficiently. This arrangement also contributes to reducing the area of the semiconductor substrate 1 and optimizing the wiring (formed by the first and the second electrical conductor layers) for connecting the macro cells 22 and 25 in the wiring regions 10.

(G) The clock signal supply lines 21(1) through 21(*s*) are connected to the input nodes of the second macro cells 22 via the contact holes 40. This means a very limited presence of clock skews stemming from the electrical connections involved.

Although the second embodiment has been shown having the first and the second common lines 16*a* through 16*c* and 18*a* through 18*c* formed by the fourth electrical conductor layer, the arrangement should not be construed as limiting the invention. The same effect may be obtained if the first and the second common lines are formed by the second electrical conductor layer as in the case of the first embodiment.

Although the second embodiment has been shown having the first and the second common lines 16*a* through 16*c* and 18*a* through 18*c* formed by the fourth electrical conductor layer and having the third common lines 20*a* through 20*c* formed by the third electrical conductor layer, the arrangement should not be construed as limiting the invention. The same effect may be obtained if the first through the third common lines 16*a* through 16*c*, 18*a* through 18*c* and 20*a* through 20*c* are formed by the second electrical conductor layer as in the case of the first embodiment.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A clock driver circuit comprising:

a plurality of internal circuits formed on a principal plane of a semiconductor substrate and each requiring a clock signal;

a plurality of clock signal supply lines formed on said principal plane of said semiconductor substrate and connected electrically to clock input nodes of predetermined internal circuits among said plurality of internal circuits; and a plurality of basic circuits for each amplifying a received clock signal and supplying the clock signals to said plurality of clock signal supply lines;

each of said plurality of basic circuits comprising:

a first common line formed on said principal plane of said semiconductor substrate for receiving the clock signals;

a plurality of predrivers formed on said principal plane of said semiconductor substrate, input nodes of said plurality of predrivers being connected electrically to said first common line;

a second common line formed on said principal plane of said semiconductor substrate and connected electrically to output nodes of said plurality of predrivers;

a plurality of main drivers formed on said principal plane of said semiconductor substrate, input nodes of said plurality of main drivers being connected electrically to said second common line; and a third common line formed on said principal plane of said semiconductor substrate and connected electrically to output nodes of said plurality of main drivers and to said plurality of clock signal supply lines.

2. A clock driver circuit according to claim 1, further comprising a clock input driver formed on said principal plane of said semiconductor substrate, an input node of said clock input driver being electrically connected via a clock input line to a clock input pad formed on said principal plane of said semiconductor substrate, an output node of said clock input driver being electrically connected to said first common line of each of said plurality of basic circuits.

3. A clock driver circuit according to claim 1, wherein said first through said third common lines are linearly arranged in a first direction on said principal plane of said semiconductor substrate;

wherein said plurality of clock signal supply lines are provided parallel to one another and arranged linearly in a second direction perpendicularly intersecting said first direction on said principal plane of said semiconductor substrate;

wherein said plurality of predrivers are arranged in said first direction on said principal plane of said semiconductor substrate; and wherein said plurality of main drivers are arranged in said first direction on said principal plane of said semiconductor substrate.

4. A clock driver circuit according to claim 3, wherein said plurality of predrivers and said plurality of main drivers are provided along a single straight line.

5. A semiconductor integrated circuit device comprising:

a plurality of internal circuits formed on a principal plane of a semiconductor substrate and each requiring a clock signal;

a plurality of clock signal supply lines formed linearly in a second direction and in parallel with one another on said principal plane of said semiconductor substrate, said plurality of clock signal supply lines being connected electrically to clock input nodes of predetermined internal circuits among said plurality of internal circuits; and a plurality of basic circuits formed in said second direction on said principal plane of said semiconductor substrate, said plurality of basic circuits each amplifying a received clock signal and supplying the clock signals to said plurality of clock signal supply lines;

each of said plurality of basic circuits comprising:

a first common line formed linearly in a first direction perpendicularly intersecting said second direction on said principal plane of said semiconductor substrate, said first common line receiving the clock signal;

a plurality of predrivers formed in said first direction and arranged predetermined distances apart on said principal plane of said semiconductor substrate, input nodes of said plurality of predrivers being connected electrically to said first common line;

a second common line formed linearly in said first direction on said principal plane of said semiconductor substrate and connected electrically to output nodes of said plurality of predrivers;

a plurality of main drivers formed in said first direction and arranged predetermined distances apart on said principal plane of said semiconductor substrate, input nodes of said plurality of main drivers being connected electrically to said second common line; and a third common line formed linearly in said first direction on said principal plane of said semiconductor substrate and connected electrically to output nodes of said plurality of main drivers and to said plurality of clock signal supply lines.

6. A semiconductor integrated circuit device according to claim 5, further comprising a clock input driver formed on said principal plane of said semiconductor substrate, an input node of said clock input driver being electrically connected via a clock input line to a clock input pad formed on said principal plane of said semiconductor substrate, an output node of said clock input driver being electrically connected to said first common line of each of said plurality of basic circuits.

7. A semiconductor integrated circuit device according to claim 6, further comprising a plurality of clock output lines for electrically connecting the output node of said clock input driver to said first common line associated with said plurality of clock driver circuits, said plurality of clock output lines having the same length.

8. A semiconductor integrated circuit device comprising:

a semiconductor substrate having a plurality of macro cell layout regions arranged in a first direction on a principal plane of the substrate; and a plurality of electrode pairs arranged in a second direction perpendicularly intersecting said first direction in each of said plurality of macro cell layout regions of said semiconductor substrate;

wherein each of said plurality of macro cell layout regions includes a plurality of N-type diffusion areas each oriented in said second direction and a plurality of P-type diffusion areas each oriented in said second direction, said plurality of N-type diffusion areas and said plurality of P-type diffusion areas being formed collectively in said first direction;

wherein each of said plurality of electrode pairs is made up of a first and a second electrode, said first electrode being formed together with an interposing insulation film between a contiguous two of said plurality of N-type diffusion areas provided in each of said plurality of macro cell layout regions, said second electrode being formed together with an interposing insulation film between a contiguous two of said plurality of P-type diffusion areas which are arranged along with said first electrode in said first direction and which are provided in the macro cell layout region in question;

wherein each of said plurality of electrode pairs and the N- and P-type diffusion areas located on both sides of the electrode pair in question constitute a basic cell;

wherein a first macro cell which is made up of a predetermined number of contiguous basic cells and which acts as a logic circuit is provided to each of said plurality of macro cell layout regions on said semiconductor substrate;

wherein a second macro cell which is made up of a predetermined number of contiguous basic cells and which acts as an internal circuit requiring a clock signal is provided to each of at least two of said plurality of macro cell layout regions;

wherein each of said plurality of macro cell layout regions having said second macro cell has a plurality of clock signal supply lines arranged linearly in said second direction and connected electrically to a clock input node of an internal circuit acting as said second macro cell provided to the corresponding macro cell layout region;

wherein said plurality of macro cell layout regions on said semiconductor substrate are divided into a plurality of portions in said second direction, each of the divided portions being provided with a basic circuit; and wherein each of the basic circuits in the corresponding divided portion comprises:

a plurality of predrivers which are composed of a predetermined number of contiguous basic cells and which are linearly arranged, said plurality of predrivers being provided to each of at least two of said plurality of macro cell layout regions on said semiconductor substrate;

a plurality of main drivers which are composed of a predetermined number of contiguous basic cells, which are each provided with said plurality of predrivers and which are linearly arranged, said plurality of main drivers being provided to each of at least two macro cell layout regions other than those provided with said plurality of predrivers on said semiconductor substrate;

a first common line formed linearly in said first direction on said plurality of predrivers and said plurality of main drivers provided to the divided portion in question, said first common line being electrically connected to input nodes of said plurality of predrivers provided to the divided portion in question;

a second common line formed linearly in said first direction on said plurality of predrivers and said plurality of main drivers provided to the corresponding divided portion, said second common line being electrically connected to output nodes of said plurality of predrivers in the corresponding divided portion as well as to input nodes of said plurality of main drivers in the corresponding divided portion; and a third common line formed linearly in said first direction on said plurality of predrivers and said plurality of main drivers provided to the corresponding divided portion, said third common line being electrically connected to output nodes of said plurality of main drivers provided to the corresponding divided portion, said third common line being further connected electrically to said plurality of clock signal supply lines.

9. A semiconductor integrated circuit device according to claim 8, further comprising a clock input driver formed on said principal plane of said semiconductor substrate, an input node of said clock input driver being electrically connected via a clock input line to a clock input pad formed on said principal plane of said semiconductor substrate, an output node of said clock input driver being electrically connected to said first common line of each of said plurality of basic circuits.

10. A semiconductor integrated circuit device according to claim 9, further comprising a plurality of clock output lines for electrically connecting the output node of said clock input driver to said first common line, said plurality of clock output lines having the same length.

11. A semiconductor integrated circuit device according to claim 8, wherein each of said divided portions comprises at least one power supply line pair composed of a power supply line fed with a supply potential and of a ground line adjacent to and in parallel with said power supply line and fed with a ground potential, said power supply line pair being linearly formed in said first direction on said principal plane of said semiconductor substrate; and wherein said plurality of predrivers and said plurality of main drivers in each of said divided portions are located between said power supply line and said ground line constituting said one power supply line pair provided to the corresponding divided portion.

12. A semiconductor integrated circuit device according to claim 8, wherein wiring inside logic circuits acting as said first macro cell, wiring inside internal circuits acting as said second macro cell, wiring between said logic circuits, and wiring between said logic circuits on the one hand and said internal circuits on the other are constituted by at least one of first and second wiring, said first wiring being arranged in said second direction and formed by a first electrical conductor layer on said plurality of electrode pairs, said second wiring being arranged in said first direction and formed by a second electrical conductor layer different from said first electrical conductor layer;

wherein said first through said third common lines are formed by said second electrical conductor layer; and wherein said plurality of clock signal supply lines are formed by said first electrical conductor layer.

13. A semiconductor integrated circuit device according to claim 8, wherein wiring inside logic circuits acting as said first macro cell, wiring inside internal circuits acting as said second macro cell, wiring between said logic circuits, and wiring between said logic circuits on the one hand and said internal circuits on the other are constituted by at least one of first and second wiring, said first wiring being arranged in said second direction and formed by a first electrical conductor layer on said plurality of electrode pairs, said second wiring being arranged in said first direction and formed by a second electrical conductor layer different from said first electrical conductor layer;

wherein said third common line and said plurality of clock signal supply lines are formed by a third electrical conductor layer which differs from said first and said second electrical conductor layers and which is formed on said plurality of electrode pairs, each of said plurality of clock signal supply lines being located immediately above the corresponding macro cell layout region; and wherein said first and said second common lines are formed by a fourth electrical conductor layer which differs from either said second electrical conductor layer or any one of said first through said third electrical conductor layers and which is provided on said plurality of electrode pairs.

14. A semiconductor integrated circuit device according to claim 8, wherein wiring inside logic circuits acting as said first macro cell, wiring inside internal circuits acting as said second macro cell, wiring between said logic circuits, and wiring between said logic circuits on the one hand and said internal circuits on the other are constituted by at least one of first and second wiring, said first wiring being arranged in said second direction and formed by a first electrical conductor layer on said plurality of electrode pairs, said second wiring being arranged in said first direction and formed by a second electrical conductor layer different from said first electrical conductor layer;

wherein said first through said third common lines are formed by said second electrical conductor layer; and wherein said plurality of clock signal supply lines are formed by a third electrical conductor layer which differs from said first and said second electrical conductor layers and which is formed on said plurality of electrode pairs, each of said plurality of clock signal supply lines being located immediately above the corresponding macro cell layout region.

* * * * *